(12) United States Patent
Bodenschatz

(10) Patent No.: US 7,636,409 B2
(45) Date of Patent: Dec. 22, 2009

(54) DIGITAL PHASE LOCKED LOOP FOR REGENERATING THE CLOCK OF AN EMBEDDED SIGNAL

(75) Inventor: John Bodenschatz, Duarte, CA (US)

(73) Assignee: Broadcom Corporation, Irvine, CA (US)

(*) Notice: Subject to any disclaimer, the term of this patent is extended or adjusted under 35 U.S.C. 154(b) by 210 days.

(21) Appl. No.: 11/557,802

(22) Filed: Nov. 8, 2006

(65) Prior Publication Data
US 2007/0086552 A1 Apr. 19, 2007

Related U.S. Application Data

(63) Continuation of application No. 09/915,472, filed on Jul. 26, 2001, now Pat. No. 7,161,998.

(60) Provisional application No. 60/274,433, filed on Mar. 9, 2001, provisional application No. 60/263,792, filed on Jan. 24, 2001, provisional application No. 60/268,840, filed on Feb. 14, 2001.

(51) Int. Cl.
*H04L 7/00* (2006.01)
*H04L 23/00* (2006.01)
*H03D 3/24* (2006.01)
*H04N 7/00* (2006.01)

(52) U.S. Cl. ............... 375/354; 375/355; 375/376; 375/377; 348/476

(58) Field of Classification Search ........... 375/240, 375/354, 260, 344, 355, 376, 377; 348/194, 348/476, 480, 482, 484, 493, 512, 725, 500, 348/505, 515, 524, 543, 545; 386/85, 86; 370/503; 704/503; 381/3
See application file for complete search history.

(56) References Cited

U.S. PATENT DOCUMENTS

| | | | | |
|---|---|---|---|---|
| 3,902,007 | A * | 8/1975 | Justice | 348/482 |
| 4,985,757 | A * | 1/1991 | Yasuki et al. | 348/604 |
| 5,483,538 | A * | 1/1996 | Rainbolt | 370/509 |
| 5,523,795 | A * | 6/1996 | Ueda | 348/480 |
| 5,796,440 | A * | 8/1998 | Rupinski et al. | 348/476 |
| 5,929,921 | A * | 7/1999 | Taniguchi et al. | 348/484 |
| 6,618,095 | B1 * | 9/2003 | Takeuchi et al. | 348/476 |
| 6,724,432 | B2 * | 4/2004 | Grigorian | 348/484 |
| 2002/0136241 | A1 * | 9/2002 | Pasqualino et al. | 370/493 |
| 2002/0163598 | A1 * | 11/2002 | Pasqualino | 348/725 |
| 2003/0122931 | A1 * | 7/2003 | Pasqualino | 348/194 |
| 2003/0206605 | A1 * | 11/2003 | Anderson | 375/355 |

* cited by examiner

*Primary Examiner*—Tesfaldet Bocure
*Assistant Examiner*—Lawrence B Williams
(74) *Attorney, Agent, or Firm*—McAndrews, Held & Malloy, Ltd.

(57) ABSTRACT

The present invention relates to a system and method for generating a first clock frequency for a plurality of digital data bursts compressed in time, where each of the plurality of digital data bursts has been multiplexed into one of a plurality of data blocks of higher speed digital data. The system and method includes acquiring the width in data elements of a digital data burst and the width in data elements of a data block of higher speed digital data. The width of one period of a clock pulse is computed at the first clock frequency. A clock pulse is generated at the first clock frequency.

20 Claims, 6 Drawing Sheets

DIGITAL PHASE LOCKED LOOP FOR REGENERATING THE CLOCK OF AN EMBEDDED SIGNAL

CROSS REFERENCE TO RELATED APPLICATIONS

This application is a continuation of "Digital Phase Locked Loop for Regenerating the Clock of an Embedded Signal", U.S. patent application Ser. No. 09/915,472, filed Jul. 26, 2001, which issued as U.S. Pat. No. 7,161,998, on Jan. 9, 2007, which is related to, and claims benefit of and priority from, Provisional Application No. 60/274,433 filed Mar. 9, 2001, titled "Digital Phase Locked Loop for Regenerating the Clock of an Embedded Signal", Provisional Application No. 60/263,792 filed Jan. 24, 2001, titled "System and Method for Increased Data Capacity of a Digital Video Link", and Provisional Application No. 60/268,840 filed Feb. 14, 2001, titled "Digital Visual Interface with Audio", the complete subject matter of which is incorporated herein by reference in its entirety.

FEDERALLY SPONSORED RESEARCH OR DEVELOPMENT

[Not Applicable]

BACKGROUND OF THE INVENTION

One embodiment of the present invention relates to regenerating a clock of an embedded signal. More specifically, one embodiment of the present invention relates to embedding audio data in a video data stream and then regenerating the clock of the embedded audio data using a phase locked loop.

Generally, audio and video data are transmitted separately in systems. Typically digital video data has a minimum of sixty frames of video per second. Each video frame is composed of horizontal scan lines, where the number of horizontal scan lines in a frame is dependent on the resolution of the system. Each horizontal scan line includes a blanking period followed by a series of digital video pixels. The horizontal blanking period is used to send timing information.

Accordingly, there is a need for system and method for using the blanking period of the video data to transmit audio data. There is a further need to embed audio data in the video data stream blanking period and then regenerate the clock of the embedded audio data using a phase locked loop for example.

Further limitations and disadvantages of conventional and traditional approaches will become apparent to one of skill in the art, through comparison of such systems with the present invention as set forth in the remainder of the present application with reference to the drawings.

SUMMARY OF THE INVENTION

One embodiment of the present invention provides a system for generating a first clock frequency for a plurality of digital data bursts compressed in time. The system includes a transmitter for transmitting a composite stream using the data bursts clocked at a second clock frequency and a receiver for receiving or acquiring said composite stream and generating the first clock frequency. The receiver includes a de-multiplexer for outputting a digital data stream at the first clock frequency; wherein said de-multiplexer includes a FIFO circuit and Digital Phase Locked Loop.

One embodiment of the present invention provides a system for generating an original clock frequency for a plurality of digital data sub-blocks, compressed in time. The system includes a multiplexer, a receiver and a phase locked loop. The multiplexer multiplexes each of the plurality of digital data sub-blocks into a plurality of data blocks of higher speed digital data. The receiver acquires the width in data elements of a digital data sub-block and the width in data elements of a data block of higher speed digital data. The phase locked loop for computes the width of one period of a clock pulse at the original clock frequency, and generating a clock pulse at the original clock frequency.

Another embodiment of the present invention comprises a method of generating an original clock frequency for a plurality of digital data bursts, compressed in time, where each of the plurality of digital data bursts has been multiplexed into one of a plurality of data blocks of higher speed digital data. The method acquires the width in data elements of a digital data burst; acquires the width in data elements of a data block of higher speed digital data; computes the width of one period of a clock pulse at the original clock frequency; and generates a clock pulse at the original clock frequency.

In another embodiment, the present invention comprises a method of generating an original clock frequency for a plurality of digital data sub-blocks compressed in time, where each of the plurality of digital data sub-blocks has been multiplexed into one of a plurality of data blocks of higher speed digital data. The method acquires the width in data elements of a digital data sub-block; acquires the width in data elements of a data block of higher speed digital data; computes the width of one period of a clock pulse at the original clock frequency; and generates a clock pulse at the original clock frequency.

Yet another embodiment of the present invention comprises a method for generating the original clock frequency for a burst of digital data compressed in time, wherein the burst of digital data has been multiplexed into a block of higher speed digital data. The method acquires the width in data elements of the burst of digital data; acquires the width in data elements of the block of higher speed digital data; computes the width of one period of a clock pulse at the original clock frequency; and generates a clock pulse at the original clock frequency.

In still another embodiment, the present invention comprises a method of generating the original clock frequency for a sub-block of digital data compressed in time, which has been multiplexed into a block of higher speed digital data. The method acquires the width in data elements of the sub-block of digital data; acquires the width in data elements of the block of higher speed digital data; computes the width of one period of a clock pulse at the original clock frequency; and generates a clock pulse at the original clock frequency.

Other aspects, advantages and novel features of the present invention, as well as details of an illustrated embodiment thereof, will be more fully understood from the following description and drawing, wherein like numerals refer to like parts.

DETAILED DESCRIPTION OF THE INVENTION

One embodiment of the present invention comprises a system and method for combining audio and video data into a composite stream. Ordinarily audio data occurs or is transmitted at a constant, continuous clock rate (i.e., an original or first clock rate) while video data is transmitted at a rate different from the first clock rate. Additionally, video data (alternatively referred to as video signals or video stream) includes a number of unused portions (i.e., blanking periods).

In one embodiment of the present invention, the audio data is split into smaller portions and inserted into lines of the video data, forming a composite stream that is transmitted at a predetermined second clock rate. In one embodiment, the second clock rate is different from the first clock rate (i.e., different pixel and line rates). For example, the second clock rate may be faster than the first clock rate, although other embodiments are contemplated. The first clock rate must be determined to regenerate the audio from the composite stream.

Figure 1:
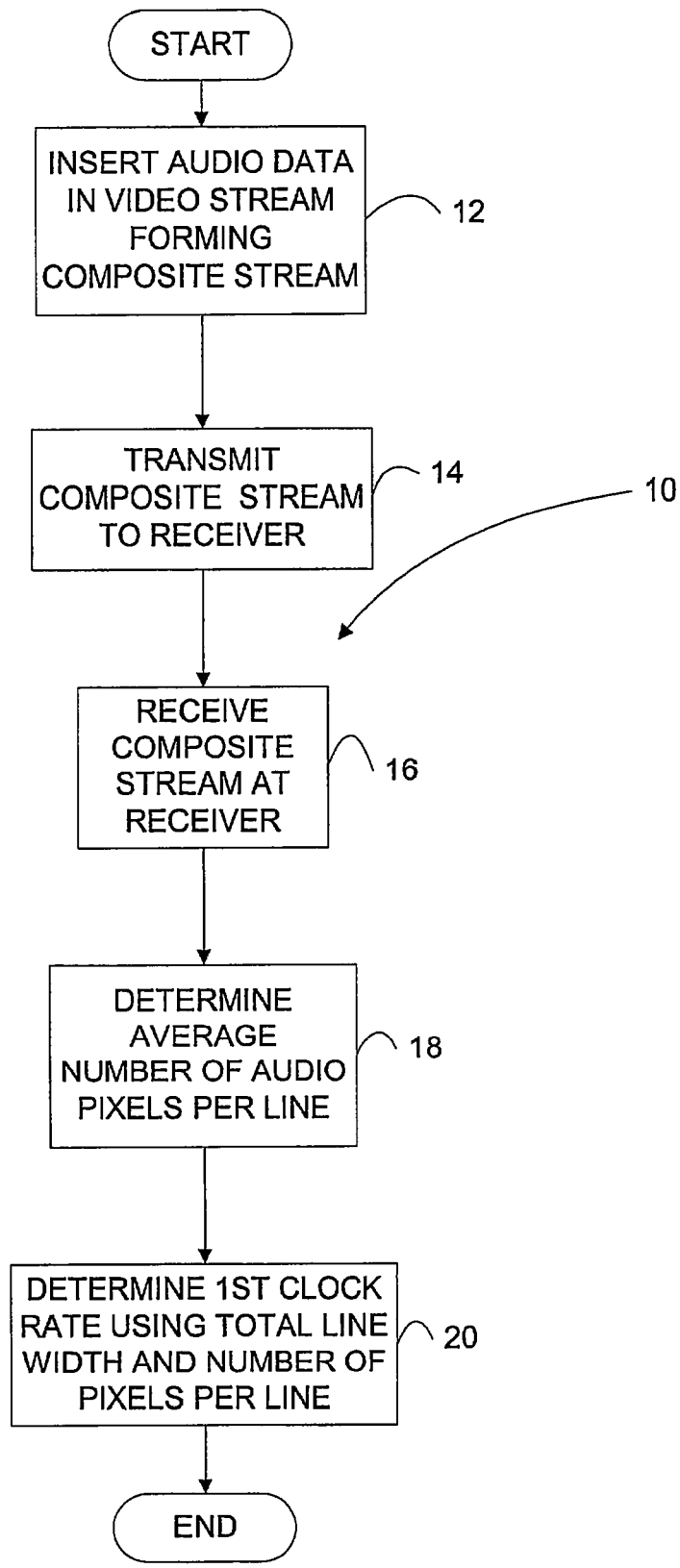
FIG. 1 illustrates a flow chart for regenerating a clock of an embedded signal transmitting audio data inserted into unused portions of a video steam.

FIG. 1 illustrates one method, generally designated 10, for regenerating a clock rate of an embedded signal transmitting audio data inserted into unused portions of the video steam. Audio data at a first clock rated is split and inserted into unused lines (blanking portions) of the video stream, forming the composite stream as illustrated by block 12.

The composite stream is transmitted to a receiver at a second clock rate as illustrated by block 14. In one embodiment, the second clock rate is different from the first clock rate, although other embodiments are contemplated. It should be appreciated that the composite stream also includes information on the number of audio samples embedded in the composite stream.

The composite stream is received by the receiver at the second clock rate as illustrated by block 16. The original clock rate must be regenerated from the composite stream. The average number of audio pixels per line is determined as illustrated by block 18 and as discussed below with respect to FIGS. 7A and 7B. The first clock rate is then determined as illustrated by block 20 using the total line width and number of audio pixels per line as discussed in greater detail below.

Figure 2:
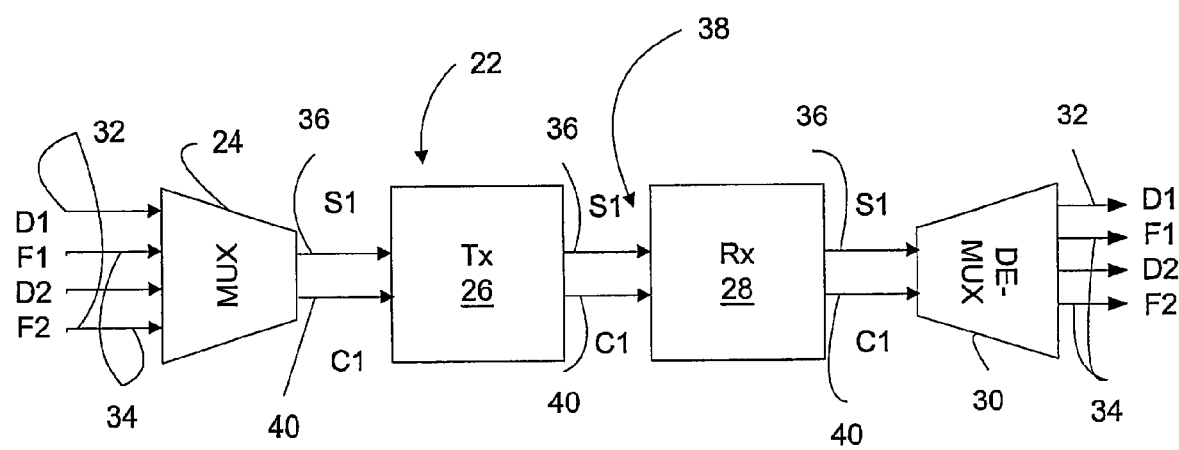
FIG. 2 illustrates a block diagram of a DVI system adapted to send data over a high speed serial ("DVI") link in accordance with one embodiment of the present invention.

A block diagram of a system 22 in accordance with one embodiment of the present invention is illustrated in FIG. 2. FIG. 2 illustrates a high speed serial link operating in accordance with a proposed standard, a Digital Video Interface ("DVI") version 1.0 standard for an audio extension ("DVI-A") for example. In one embodiment, system 22 comprises a multiplexer (MUX) 24, a transmitter (Tx) 26, a receiver (Rx) 28 and a de-multiplexer (DE-MUX) 30. It should be appreciated that the components are illustrated as separate units although other combinations are contemplated. For example, the mux 24 and the transmitter 26 could be combined into a single unit and receiver 28 and de-mux 30 could be combined into a single unit.

In one embodiment, the DVI 1.0 standard makes significant use of existing VESA Computer Display standards. The sequence of timing and video data for particular display resolutions is specified in the VESA Computer Display Monitor Timing standard, Version 1.0, Revision 0.8 dated Sep. 17, 1998, and incorporated herein by reference. A recent digital television standard is the CEA-EIA 861 standard for high speed digital interfaces, also incorporated herein by reference.

The DVI Version 1.0 specification provides for a high-speed digital connection for visual data types that are display technology independent. The interface is primarily focused at providing a connection between a computer and its display device.

The DVI link enables content to remain in the lossless digital domain from creation to consumption. An exemplary DVI link has three parallel channels for RGB video data and one clock channel. DVI-A provides for a straightforward extension of DVI 1.0, incorporating additional digital channels over the DVI link. This extension is focused primarily on providing a means of transmitting multiple audio streams over the DVI 1.0 link.

System 22 transmits a plurality of data streams D1 . . . DN, generally designated 32, where the number of data streams 32 range anywhere between 2 and 10, 2 and 20, 20, 2 and 100 or 2 and infinity for example. Prior to multiplexing, each of the data streams is originally clocked at clock frequency F1 . . . FN, generally designated 34 and referred to as the "original clock frequencies", where N ranges anywhere between 2 and 1,000,000 for example, so that each data stream 32 has a corresponding one clock frequency. For example, one of the pluralities of data streams D1 is originally clocked at clock frequency F1 prior to multiplexing. It should be appreciated that all the data streams may be originally clocked at the same clock frequency, at different clock frequencies or that one or more data streams may be clocked at one frequency and other data streams clocked at other data frequencies.

Mux 24 multiplexes the plurality of data streams together prior to transmission by the transmitter 26. In one embodiment, composite stream S1, generally designated 36, comprises a plurality of data streams, including audio and video data for example, multiplexed together using mux 24. The composite stream is discussed in greater detail with respect to FIG. 3.

FIG. 2 illustrates a high speed serial digital data link 38 (i.e., DVI link) between the transmitter and receiver. The DVI link enables the transmitter to communicate with the receiver as illustrated. For example, the DVI link enables a computer video card to communicate with a cable television set-top box or a computer monitor and a television or other video display device. It should be appreciated that while the multiplexing and de-multiplexing arrangement is discussed with respect to a DVI link, the subject invention is applicable to other communication links. The transmitter 26 transmits or sends a digital data stream 36 along with a data link clock frequency 40 to the receiver 28 via the digital data link 32.

The multiplexed data stream S1 36 is de-multiplexed into the plurality of original data streams clocked at their respective original clock frequencies F1 using de-mux 30. In one embodiment, the data link clock frequency is higher than the original clock frequencies and is not an integer multiple thereof. More specifically, C1 is greater than, and not an integer multiple of, F1 for example, although other relationships are contemplated. The lower clock frequency F1 is not available to the receiver 28, but is regenerated by the receiver 28 in order to provide one or more output signals D1 . . . DN along with the corresponding one regenerated clock frequencies F1 . . . FN.

Figure 3:
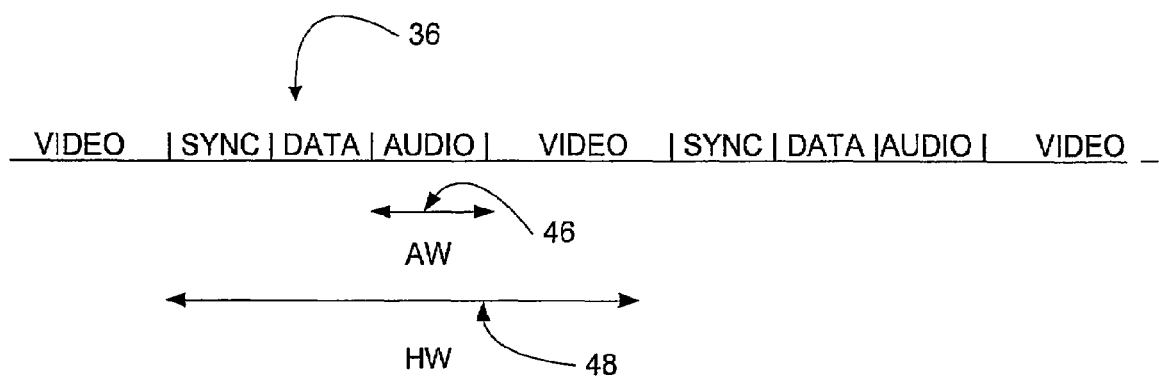
FIG. 3 illustrates a timing diagram of a horizontal scan line of a composite stream of audio and video data transmitted over a DVI link in accordance with one embodiment of the present invention.

One example of a composite stream 36 is illustrated in FIG. 3. More specifically, FIG. 3 illustrates a timing diagram of a horizontal scan line of a DVI system 22 that sends audio and video data over the DVI link in accordance with one embodiment of the present invention. In the illustrated embodiment, the composite stream S1 comprises a plurality of digital data streams of audio and video data multiplexed together.

In one embodiment, the de-mux 30 is used to extract the audio data D1 from the composite stream and output the audio data at the original clock frequency. The composite stream S1 is, in one example, comprised of a series of data blocks. In one embodiment, each data block corresponds to one scan line for a digital video system. Each data block is composed of sub-blocks, where D1 is one of the sub-blocks.

The sub-blocks correspond to the various different data in one scan line, such as, synchronization, audio, video and other data. The D1 sub-block corresponds to the audio data sent in each scan line. It should be appreciated that, the number of data elements in each of the D1 sub-blocks will vary from block to block, but the aggregate data rate of D1 will, in one example, remain constant. AW, generally designated 46, represents the width of the audio section of a particular scan line in pixels for example. It should be appreciated that this value may vary from line to line. HW, generally designated 48, represents the horizontal width of the video scan line in pixels.

Figure 4:
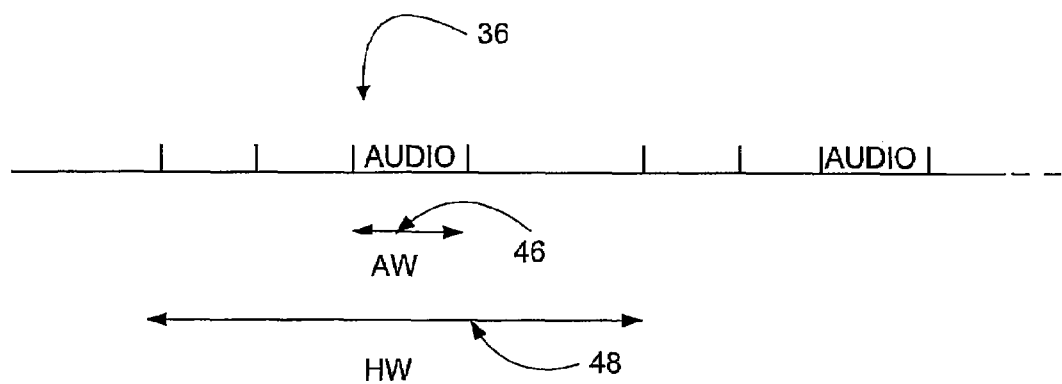
FIG. 4 illustrates a timing diagram of a burst of audio data extracted from a horizontal scan line similar to that illustrated in FIG. 3 in accordance with one embodiment of the present invention.

The D1 sub-blocks are extracted from data blocks in the composite stream using a timing window or other processing method or device. FIG. 4 illustrates a timing diagram of a burst of audio data (D1) extracted from a horizontal scan line similar to that illustrated in FIG. 3 in accordance with one embodiment of the present invention. The stream of extracted D1 sub-blocks is represented as a series of data bursts of variable length, as illustrated. Each data block sent by the transmitter 26 includes a data element containing the length of the D1 sub-block within that block. This information is provided to the receiver 28.

Figure 5:
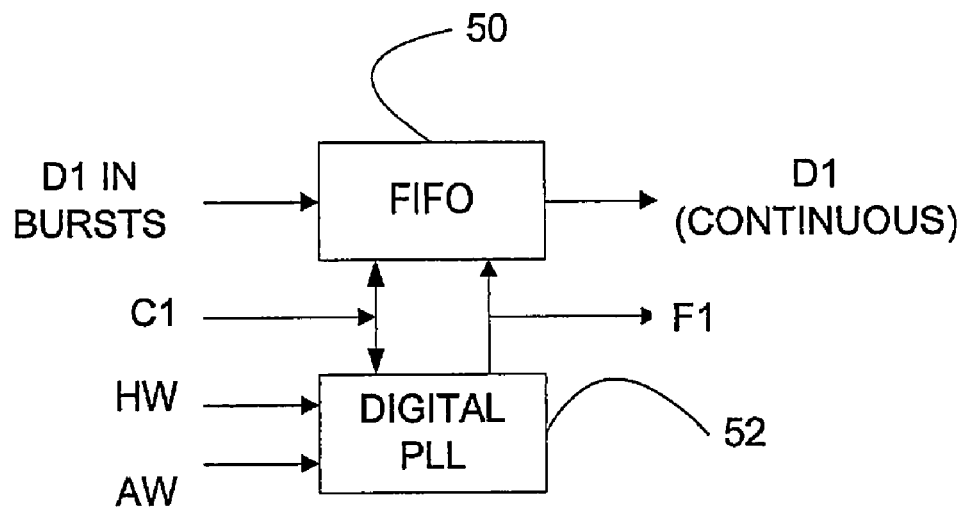
FIG. 5 illustrates a block diagram of a FIFO circuit and Phase Locked Loop used to output the audio data stream at the original audio clock frequency in accordance with one embodiment of the present invention.

FIG. 5 illustrates a block diagram of a FIFO circuit 50 and Phase Locked Loop ("PLL") 52 used to output the audio data stream at the original clock frequency in accordance with one embodiment of the present invention. In one embodiment, the FIFO circuit 50 and PLL 52 are incorporated in and part of de-mux 30. However, it should be appreciated that FIFO circuit, PLL and the de-mux may be separate units coupled together.

The variable length bursts of digital data D1 at clock rate C1 are transmitted to the FIFO circuit 50. The data stream D1 may be returned to its original timing, by clocking it out of the FIFO using clock F1. However, it should be appreciated that clock F1 is not available to the receiver 28 and must be regenerated from the information available to the receiver. The regenerated clock F1 preferably has low jitter, so as to clock D1 out of the FIFO circuit at a constant frequency.

Figure 6:
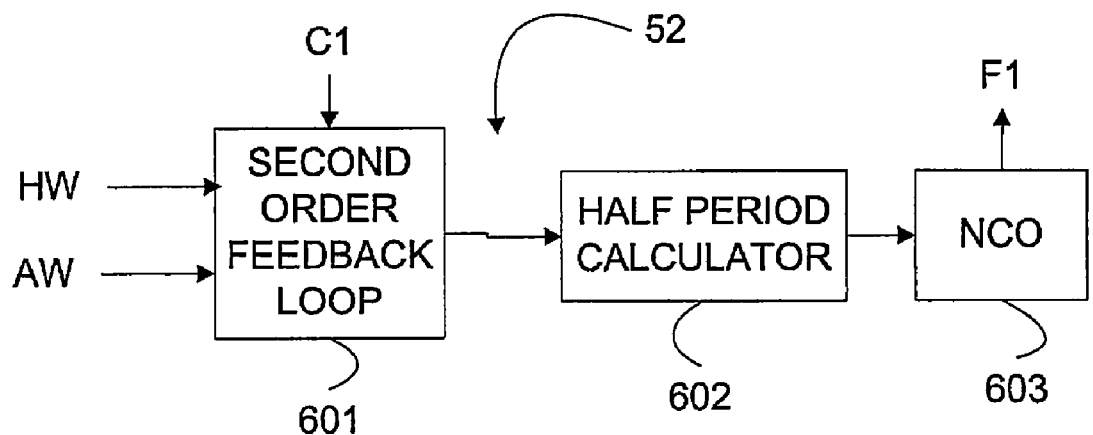
FIG. 6 illustrates a block diagram of the subsystems within the Phase Locked Loop illustrated in FIG. 5.

FIG. 6 illustrates a block diagram of one embodiment of the subsystems of PLL 52 illustrated in FIG. 5. Preferably PLL 52 is all-digital for example, although other embodiments are contemplated. A second order feedback loop 601 determines the period, performing the operations illustrated in FIGS. 7A and 7B. A half period calculator 602 performs the operations illustrated in FIG. 8. A numerically controlled oscillator ("NCO") 603, inverts its output every half period, generating the F1 clock. It should be appreciated that the NCO 603 could be made of various circuits well known to those skilled in the art.

Figure 7A:
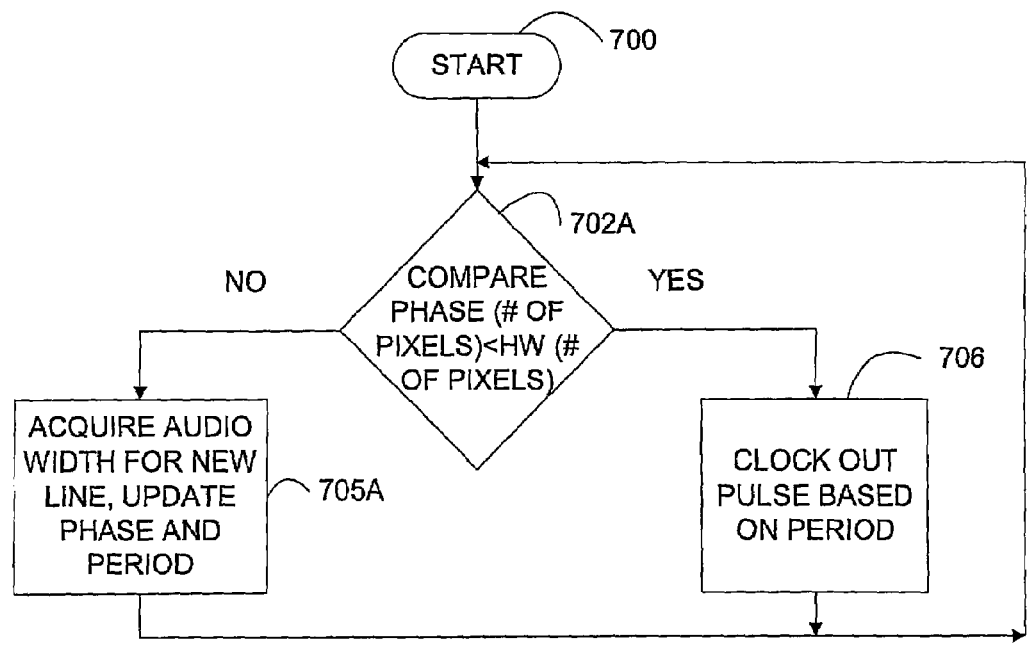
FIGS. 7A and 7B illustrate flow charts of the operations performed by a second order feedback loop of the phase locked loop of FIG. 6 in accordance with one embodiment of the present invention.
Figure 7B:
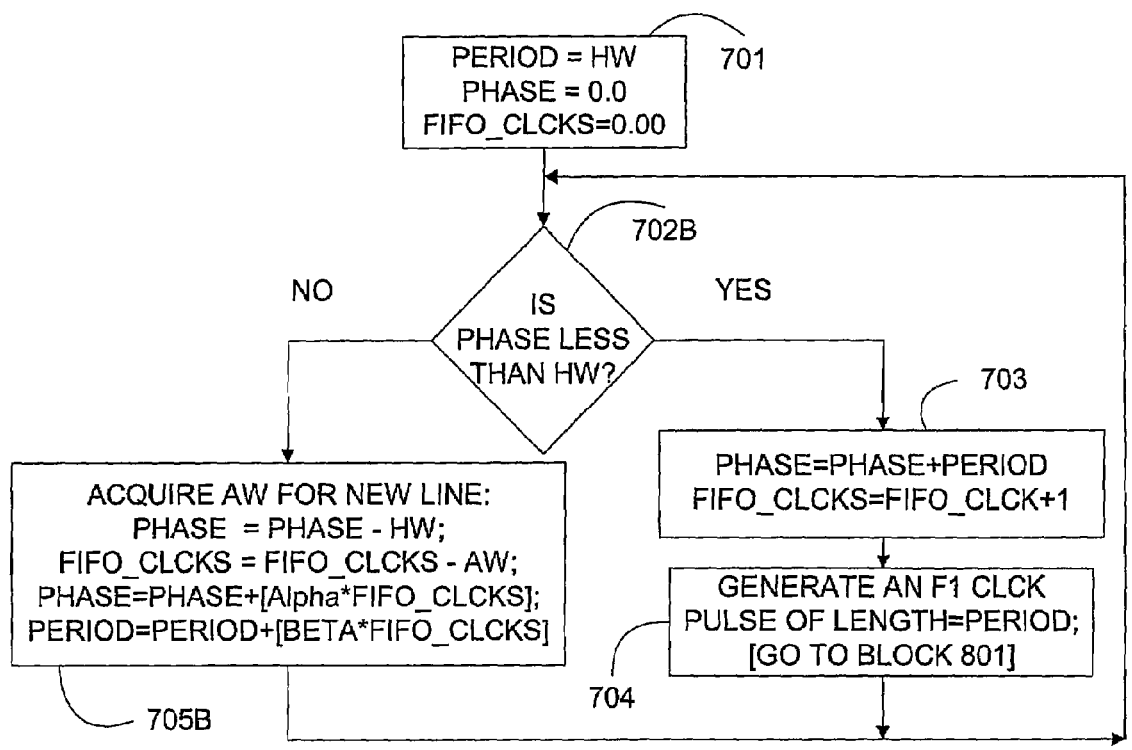

One embodiment of the present invention uses an all-digital PLL to generate clock F1 from the clock C1. It should be appreciated that in one embodiment clock C1 has a higher speed than clock F1 for example, although other arrangements are contemplated. One process for generating the original or first clock frequencies from the higher speed clock C1 is illustrated in FIGS. 7A and 7B. An overview of the process is illustrated in FIG. 7A, while a more detailed process is illustrated in FIG. 7B. In this embodiment, the operations are performed by the second order feedback loop of an all-digital PPL, for example.

To determine the Period (i.e., generate the original clock frequency), the method is initiated and the phase is compared to the horizontal width as illustrated by block 700 and diamond 702A. The phase and horizontal width are represented as number of pixels. If the phase is smaller than HW then the original clock frequency is clocked out based on the period as illustrated by block 706. The process continuously compares the phase to HW to insure proper sync.

If the phase is not less than HW, that is the phase is equal to or greater than HW as illustrated by diamond 702A, then an audio width for a new line is acquired as illustrated by block 705A. Acquiring an audio width for a new line includes updating the phase and Period. The updated phase is compared to HW in a continuous fashion, as this is a phase locked loop. At some point during this process the period stops changing, but the phase is continuously compared to HW to insure proper sync during the process.

The process illustrated in FIG. 7A is shown in greater detail in FIG. 7B. The PLL is initiated as illustrated by block 701 (block 700 of FIG. 7A). HW 48 represents the horizontal width of a video scan line in pixels, where HW is equal to the Period (i.e., the computing period). After convergence (i.e., when the system reaches a steady-state value), the Period variable is equal to the period of clock F1, for example, in C1 clock cycles. The Phase variable is the relative position of the PLL within a scan line, for example 0.0. The FIFO_clocks variable is used to track the difference between the total number of clock pulses F1 generated by the PLL and the total amount of data sent into the PLL, here 0.00 for example.

The Phase is compared to HW as illustrated by diamond 702B. If Phase is less than HW, the Phase variable is incremented by the Period and FIFO_clocks is incremented by one. For example, If Phase is less than HW, then the new Phase is equal to the Phase plus the Period while the FIFO_clocks is equal to the FIFO_clocks plus 1 as illustrated by block 703. An F1 clock is generated as illustrated by block 704. In one example, the pulse length of F1 is equal to the Period. The process proceeds to a set of operations illustrated in FIG. 8, stating at block 801 as discussed in greater detail below. After generating one clock pulse using the operations illustrated in FIG. 8, the process returns to block 704 and loops back to block 702 in a continuous manner. It should be appreciated that the process described in blocks 703 and 704 are, in one example, equal to clocking out the original clock frequency based on the period as illustrated by block 706 of FIG. 7A.

If the Phase is not less than HW as illustrated by diamond 702B, then the PLL initiates processing a new scan line as illustrated by block 705B. A new value is acquired for AW. The Phase and FIFO_clocks are decremented and a new Phase and Period are computed.

For example, if the Phase is equal to or greater than HW, the new Phase equals the Phase minus the value of HW and the FIFO_clocks equals FIFO_clocks minus the value of AW. The new phase is equal to Phase+[ALPHA times the FIFO_clocks value]. The new Period is equal to the Period+[Beta times the FIFO_clocks value]. It should be appreciated that Alpha and Beta are constants for a second order PLL, used to set the speed and other operational characteristics of the PLL. The following equations for a second order PLL are well known to those skilled in the art:

Error=True Phase−Phase

Phase=Phase+[Alpha*Error]+Frequency

Frequency=Frequency+[Beta*Error]

Output jitter may be reduced by spreading the phase update across more than one audio clock as illustrated by block 705B, instead of doing it all at once.

The system and method illustrated in FIGS. 7A and 7B compute a value for the Period of original clock frequencies, in terms of C1 clock pulses. In one example, this computation is represented by the following equation:

$$\frac{HW}{AverageAW} = \frac{C1}{F1} = \text{Period of } F1 (\text{In } C1 \text{ clock cycles})$$

The convergence of the Period of F1 to the original value of the period of F1 takes place through the incremental computations performed by the operations illustrated in FIGS. 7A and 7B.

Figure 8:
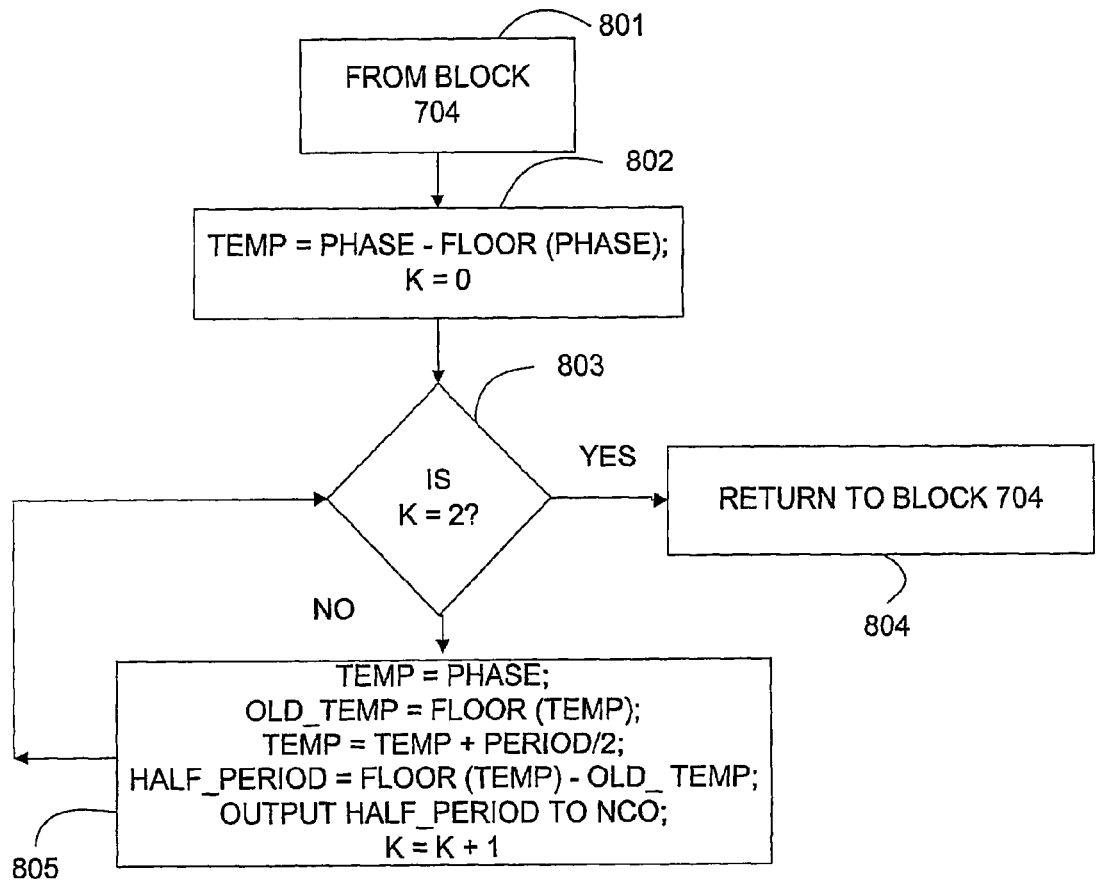
FIG. 8 illustrates a flow chart of the operations performed by a half period calculator of a digital phase locked loop in accordance with one embodiment of the present invention.

FIG. 8 illustrates a series of operations performed by a half period calculator. The half period calculator generates one full cycle of clock F1. Block 704 in FIG. 7B outputs a value of Period for clock F1, for example, in terms of the number of pulses of clock C1 as illustrated by Block 801.

The Temp variable is set equal to a fractional part of the value of Phase, computed in block 703 with a counter variable K set equal to zero for example as illustrated by block 802. The value of K is tested as illustrated by diamond 803. If the value of K If the value of K is equal to two, then two half cycles of a single clock pulse of frequency F1 have been outputted by the NCO 603 illustrated in FIG. 6. Flow then returns to the process described by block 704 in FIG. 7B.

If the value of K is not equal to two, then a value of Half_Period is computed using a series of steps as illustrated by block 805. The value of Half_Period is equal to one half of the period of clock F1. The loop consisting of diamond 803 and block 805 is performed twice, thus generating two half periods of clock F1, (one full pulse), by the NCO 603. The NCO generates one cycle of clock F1 of length equal to the Period variable, where the Period is equal to a number of C1 clock pulses, used as a timing reference.

Figure 9:
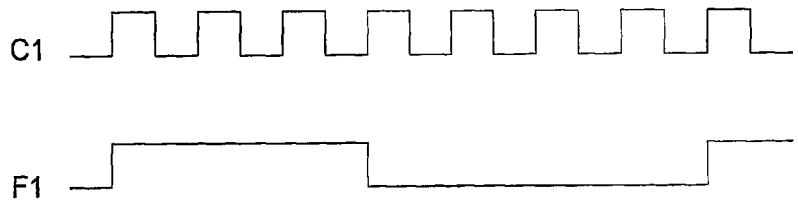
FIG. 9 illustrates a timing diagram of one example of a possible timing relationship between a data link clock C1 and a regenerated clock F1 in accordance with one embodiment of the present invention.

FIG. 9 is a timing diagram illustrating one example of a possible timing relationship between a data link clock C1 and a regenerated audio clock F1. As an example, the present invention can compute a value for the period of F1 equal to 7 clock pulses of C1. Since the period of F1 as computed, is an odd number, the digital PLL, for example, can output one cycle of clock F1 with a first half period of length equal to three C1 clock pulses and a second half period of length equal to four C1 clock pulses as a rough approximation of the period of F1. FIG. 9 illustrates such an F1 pulse of total length 7, consisting of two-half periods, of three and four C1 clock pulses long. If needed, other clock frequencies can be generated in a similar manner.

The jitter in such a pulse is high and is provided to illustrate one example of an operation of the invention. If realistic clock speeds are used for such a calculation, 165 MHz for a C1 clock and 96 KHz for a F1 clock for example, then the period of F1 is equal to 1718.75 pulses of C1 for example. The present invention would then output a series of half pulses of length either 1718 or 1719 in a pattern of four pulses, with three of length 1719 and one length 1718. Such a pattern would be sufficient to generate an F1 clock of 96 KHz with low jitter.

In an alternate embodiment, the output F1 of the digital PLL of may be sent to an analog PLL, prior to sending it to the FIFO, in order to reduce the jitter of the regenerated clock F1.

In another alternate embodiment, two digital PLLs in series may be used in place of PLL 52. The first PLL provides a rough approximation of the period of the clock F1 and the second PLL provides a more accurate approximation of the period of the clock F1.

In yet another alternate embodiment, three PLLs in series may be used in place of PLL 52. The first PLL is a digital PLL, which provides a rough approximation of the period of the clock of F1. The first digital PLL is followed by a second digital PLL, which provides a more accurate approximation of the period of the clock of F1. The second PLL is followed by a third PLL, which is an analog PLL, which can further reduce the jitter of the regenerated F1 clock.

Many modifications and variations of the present invention are possible in light of the above teachings. Thus, it is to be understood that, within the scope of the appended claims, the invention may be practiced otherwise than as described hereinabove.

The invention claimed is:

1. A system for generating digital data bursts at a first clock rate, the system comprising: a receiver for acquiring a composite stream, determining a total number of audio samples per line in said acquired composite stream, wherein the total number of audio samples per line is varying, and determining the first clock rate, wherein determining the first clock rate includes using a total line width and the varying total number of audio samples in each line.

2. The system of claim 1, further including a transmitter for forming said composite stream.

3. A method of generating data bursts at a first clock rate, said method comprising the steps of: forming a composite stream of audio and video data at a transmitter; acquiring said composite stream at a receiver; and determining the first clock rate for the data bursts from said composite stream at the receiver, wherein determining the first clock rate includes using a total line width and a number of audio samples in each line, wherein the number of audio samples per line is varying.

4. The method of claim 3, including transmitting said composite stream at a second clock rate.

5. The method of claim 4, wherein said second clock rate is greater than the first clock rate.

6. The method of claim 3, including computing the average number of audio samples per line.

7. The method of claim 3, including inserting audio data into video data forming said composite stream.

8. The method of claim 3, including acquiring a width in data elements of a digital data burst.

9. The method of claim 3, including acquiring a width in data elements of a data block of higher speed digital data.

10. The method of claim 3, including computing a width of one period of a clock pulse at the first clock rate.

11. The system of claim 1, wherein the composite stream is clocked at a second clock rate, wherein said second clock rate is greater than the first clock rate.

12. The system of claim 1, wherein the receiver computes an average number of audio samples per line.

13. The system of claim 2, wherein the transmitter inserts audio data into video data forming said composite stream.

14. The system of claim 1, wherein the receiver acquires a width in data elements of a digital data burst.

15. The system of claim 1, wherein the receiver acquires a width in data elements of a data block of higher speed digital data.

16. The system of claim 1, wherein the receiver computes a width of one period of a clock pulse at the first clock rate.

17. The system of claim 1, wherein the first clock rate is initially unknown.

18. The method of claim 3, wherein the first clock rate is initially unknown.

19. The system of claim 6, wherein the first clock rate is initially unknown.

20. The method of claim 12, wherein the first clock rate is initially unknown.

\* \* \* \* \*

UNITED STATES PATENT AND TRADEMARK OFFICE
CERTIFICATE OF CORRECTION

PATENT NO. : 7,636,409 B2  Page 1 of 1
APPLICATION NO. : 11/557802
DATED : December 22, 2009
INVENTOR(S) : John Bodenschatz It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 254 days.

Signed and Sealed this

Ninth Day of November, 2010

David J. Kappos
*Director of the United States Patent and Trademark Office*